US005153525A

United States Patent [19]

Hoekman et al.

[11] Patent Number: 5,153,525

[45] Date of Patent: Oct. 6, 1992

[54] VEHICLE DETECTOR WITH SERIES RESONANT OSCILLATOR DRIVE

[75] Inventors: Earl B. Hoekman, Roseville; Steven M. Hamer, Willernie, both of Minn.

[73] Assignee: Minnesota Mining and Manufacturing Company, St. Paul, Minn.

[21] Appl. No.: 716,010

[22] Filed: Jun. 17, 1991

[51] Int. Cl.[5] .............. G01R 27/26

[52] U.S. Cl. .............. 324/655; 324/654; 324/207.16; 340/941; 331/65

[58] Field of Search .............. 324/652, 654, 655, 668, 324/675, 682, 207.16, 207.26, 227, 232, 336; 340/941; 331/65

[56] References Cited

U.S. PATENT DOCUMENTS

| | | | |
|---|---|---|---|
| 3,375,493 | 3/1968 | Gottlieb | 340/941 X |
| 3,875,555 | 4/1975 | Potter | 340/941 |
| 3,911,389 | 10/1975 | Mills | 340/941 |
| 3,943,339 | 3/1976 | Koerner et al. | 235/92 |
| 3,989,932 | 11/1976 | Koerner | 235/92 |
| 4,219,740 | 8/1980 | Little | 324/654 X |
| 4,333,052 | 6/1982 | Schmall | 324/207.26 |
| 4,368,428 | 1/1983 | Dijkman | 324/178 |
| 4,430,636 | 2/1984 | Bruce | 324/236 X |
| 4,449,115 | 5/1984 | Koerner | 340/941 |
| 4,459,561 | 7/1984 | Clark et al. | 331/65 |
| 4,472,706 | 9/1984 | Hodge et al. | 340/941 |
| 4,477,772 | 10/1984 | So | 324/654 |
| 4,491,841 | 1/1985 | Clark | 340/939 |
| 4,668,951 | 5/1987 | Duley et al. | 340/941 |
| 4,862,162 | 8/1989 | Duley | 340/938 |
| 4,873,494 | 10/1989 | Jefferis | 331/65 |
| 4,949,054 | 8/1990 | Briefer | 331/117 |

*Primary Examiner*—Jack B. Harvey
*Assistant Examiner*—Glenn W. Brown
*Attorney, Agent, or Firm*—Gary L. Griswold; Walter N. Kirn; William B. Barte

[57] ABSTRACT

An inductive sensor is driven by a series resonant oscillator circuit to produce an oscillator signal having a frequency which is a function of inductance of the inductive sensor. An inductive load, which includes the sensor, is connected in series with a capacitive impedance. Power to the series resonant circuit formed by the inductive load and the capacitive impedance is controlled as a function of current in the series circuit as sensed by a current sensor. A detection system provides a detector output based upon the frequency of the oscillator signal.

21 Claims, 4 Drawing Sheets

VEHICLE DETECTOR WITH SERIES RESONANT OSCILLATOR DRIVE

BACKGROUND OF THE INVENTION

The present invention relates to an oscillator used to drive an inductive sensor. In particular, the present invention relates to detection systems such as a vehicle detector which use inductive sensors.

Inductive sensors are used for a wide variety of detection systems. For example, inductive sensors are used in systems which detect the presence of conductive or ferromagnetic articles within a specified area. Vehicle detectors are a common type of detection systems in which inductive sensors are used.

Vehicle detectors are used in traffic control systems to provide input data required by a controller to control signal lights. Vehicle detectors are connected to one or more inductive sensors and operate on the principle of an inductance change caused by the movement of a vehicle in the vicinity of the inductive sensor. The inductive sensor can take a number of different forms, but commonly is a wire loop which is buried in the roadway and which acts as an inductor.

The vehicle detector generally includes circuitry which operates in conjunction with the inductive sensor to measure changes in inductance and to provide output signals as a function of those inductance changes. The vehicle detector includes an oscillator circuit which produces an oscillator output signal having a frequency which is dependent on sensor inductance. The sensor inductance is in turn dependent on whether the inductive sensor is loaded by the presence of a vehicle. The sensor is driven as a part of a resonant circuit of the oscillator. The vehicle detector measures changes in inductance in the sensor by monitoring the frequency of the oscillator output signal.

Examples of vehicle detectors are shown, for example, in U.S. Pat. No. 3,943,339 (Koerner et al.) and in U.S. Pat. No. 3,989,932 (Koerner).

In the past, vehicle detectors have typically used constant voltage resonant type oscillators, such as Colpitts, Pierce, or positive feedback logic inverter oscillator circuits. An example of a Colpitts oscillator used as the sensor drive oscillator in a vehicle detector is shown in FIG. 14 of the Koerner et al U.S. Pat. No. 3,943,339.

The inductive sensors connected to a vehicle detector can have a nominal inductance which varies significantly. In addition, the inductive sensors can be located at varying distances from the vehicle detector, which results in variation in the sensor resistance and inductance contributed by the lead-in cables which connect the sensor to the vehicle detector.

It is extremely desirable that the current supplied to the inductive sensor be sinusoidal with minimal distortion. The presence of distortion can affect the accuracy of the oscillator frequency measurements, which are based on the fundamental frequency of the oscillator signal.

The prior art sensor drive oscillators have been capable of providing sine-wave oscillation for some load ranges, but they are not capable of providing sinewave oscillation over the range of loads described above. Increased distortion leads to increased instability in the ability to discern the fundamental frequency of the oscillator.

In addition, with the prior art oscillators, the inductive sensor is driven with a constant voltage. The larger the inductance of the sensor, and the higher the resistance of the lead-in cable to the sensor, the lower the value of drive current supplied to the sensor. This is significant because the sensitivity of the inductive sensor can be a function of the drive current as well as the location of the object being sensed. A change in the drive current being supplied to the inductive sensor can change the magnitude of the apparent inductance changes exhibited by that sensor for a particular vehicle.

An improved sensor drive oscillator which is capable of providing sine-wave oscillation over a wide range of inductive loads, which can be started and stopped quickly, and which provides consistent drive current for a number of different sensor configurations with different inductances and losses would be highly desirable.

SUMMARY OF THE INVENTION

The present invention is a series resonant oscillator circuit to drive an inductive load (which includes an inductive sensor), and a detection system which uses the series resonant oscillator circuit and inductive sensor. The series resonant oscillator circuit has the inductive load connected in the series path with a capacitive impedance. An oscillator signal which provides power to the series path is controlled as a function of current sensed in the series path. The frequency of the oscillator signal changes as a function of changes in inductance of the inductive sensor.

In preferred embodiments of the present invention the series resonant oscillator circuit includes a feedback circuit for deriving positive and negative feedback signals from a current sensor and supplying those feedback signals to an amplifier which produces the oscillator signal. The oscillator circuit preferably includes means for changing relative levels of positive and negative feedback during each half cycle of the oscillator signal. By controlling the oscillator signal as a function of current in the series path, the oscillator circuit maintains a constant AC current drive to the inductive sensor regardless of nominal loop inductance and resistance of the lead-in cables to the inductive sensor.

DETAILED DESCRIPTION OF THE PREFERRED EMBODIMENTS

Figure 1:
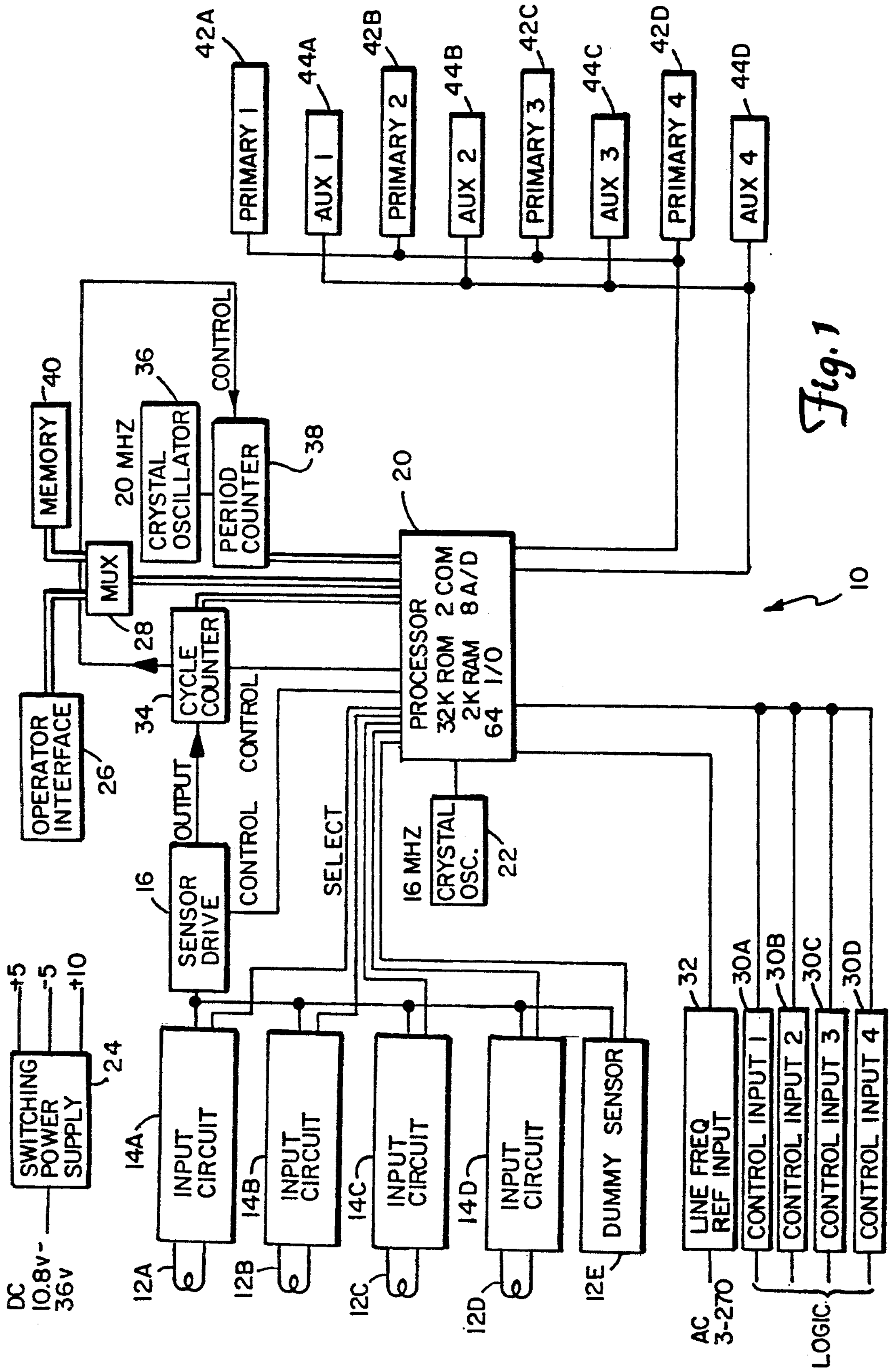
FIG. 1 is a block diagram of a vehicle detector which makes use of the series resonant oscillator circuit of the present invention.

Vehicle detector 10 shown in FIG. 1 is a four channel system which monitors the inductance of inductive sensors 12A, 12B, 12C and 12D. Each inductive sensor 12A–12D is connected to an input circuit 14A–14D, respectively. Sensor drive oscillator 16 is selectively connected through input circuits 14A–14D to one of the inductive sensors 12A–12D to provide a drive current to one of the inductive sensors 12A–12D. The particular inductive sensor 12A–12D which is connected to oscillator 16 is based upon which input circuit 14A–14D receives a sensor select signal from digital processor 20. Sensor drive oscillator 16 produces an oscillator signal having a frequency which is a function of the inductance of the inductive sensors 12A–12D to which it is connected.

Also shown in FIG. 1, dummy sensor 12E is provided and is connected to sensor drive oscillator 16 in response to a select signal from digital processor 20. Dummy sensor 12E has an inductance which is unaffected by vehicles, and therefore provides a basis for adjustment or correction of the values measured by inductive sensors 12A–12D.

The overall operation of vehicle detector 10 is controlled by digital processor 20. Crystal oscillator 22 provides a high frequency clock signal for operation of digital processor 20. Power supply 24 provides the necessary voltage levels for operation of the digital and analog circuitry within the vehicle detector 10.

Digital processor 20 receives inputs from operator interface 26 (through multiplexer 28), and receives control inputs from control input circuits 30A–30D. In a preferred embodiment, control input circuits 30A–30D receive logic signals, and convert those logic signals into input signals for processor 20.

Processor 20 also receives a line frequency reference input signal from line frequency reference input circuit 32. This input signal aids processor 20 in compensating signals from inductive sensors 12A–12D for inductance fluctuations caused by nearby power lines.

Cycle counter 34, crystal oscillator 36, period counter 38, and processor 20 form detector circuitry for detecting the frequency of the oscillator signal. Counters 34 and 38 may be discrete counters (as illustrated in FIG. 1) or may be fully or partially incorporated into processor 20.

In a preferred embodiment of the present invention, digital processor 20 includes on-board read only memory (ROM) and random access memory (RAM) storage. In addition, non-volatile memory 40 stores additional data such as operator selected settings which are accessible to processor 20 through multiplexer 28.

Vehicle detector 10 has four output channels, one for each of the four sensors 12A–12D. The first output channel, which is associated with inductive sensor 12A, includes primary output circuit 42A and auxiliary output circuit 44A. Similarly, primary output circuit 42B and auxiliary output circuit 44B are associated with inductive sensor 12B and form the second output channel. The third output channel includes primary output circuit 42C and auxiliary output circuit 44C, which are associated with inductive sensor 12C. The fourth channel includes primary output circuit 42D and auxiliary output circuit 44D, which are associated with inductive sensor 12D.

Processor 20 controls the operation of primary output circuits 42A–42D, and also controls the operation of auxiliary output circuits 44A–44D. The primary output circuits 42A–42D provide an output which is conductive even when vehicle detector 10 has a power failure. The auxiliary output circuits 44A–44D, on the other hand, have outputs which are non-conductive when power to vehicle detector 10 is off.

In operation, processor 20 provides sensor select signals to input circuits 14A–14D to connect sensor drive oscillator 16 to inductive sensors 12A–12D in a time multiplexed fashion. Similarly, a sensor select signal to dummy sensor 12E causes it to be connected to sensor drive oscillator 16. Processor 20 also provides a control input to sensor drive oscillator 16 to select alternate capacitance values used to resonate with the inductive sensor 12A–12D or dummy sensor 12E. When processor 20 selects one of the input circuits 14A–14D or dummy sensor 12E, it also enables cycle counter 34. As sensor drive oscillator 16 is connected to an inductive load (e.g., input circuit 14A and sensor 12A) it begins to oscillate. The oscillator signal is supplied to cycle counter 34, which counts oscillator cycles. After a brief stabilization period for the oscillator signal to stabilize, processor 20 enables period counter 38, which counts in response to a very high frequency (e.g., 20 MHz) signal from crystal oscillator 36.

When cycle counter 34 reaches the predetermined number ($N_{seg}$) of oscillator cycles after oscillator stabilization, it provides a control signal to period counter 38, which causes counter 38 to stop counting. The final count contained in period counter 38 is a function of the frequency of the oscillator signal, and therefore the inductance of inductive sensor 12A. A change in the count which exceeds a predetermined threshold indicates the presence of a vehicle near sensor 12A, and processor 20 provides the appropriate signals to primary and auxiliary output circuits 42A and 44A to signal the presence of a vehicle.

Figure 2:
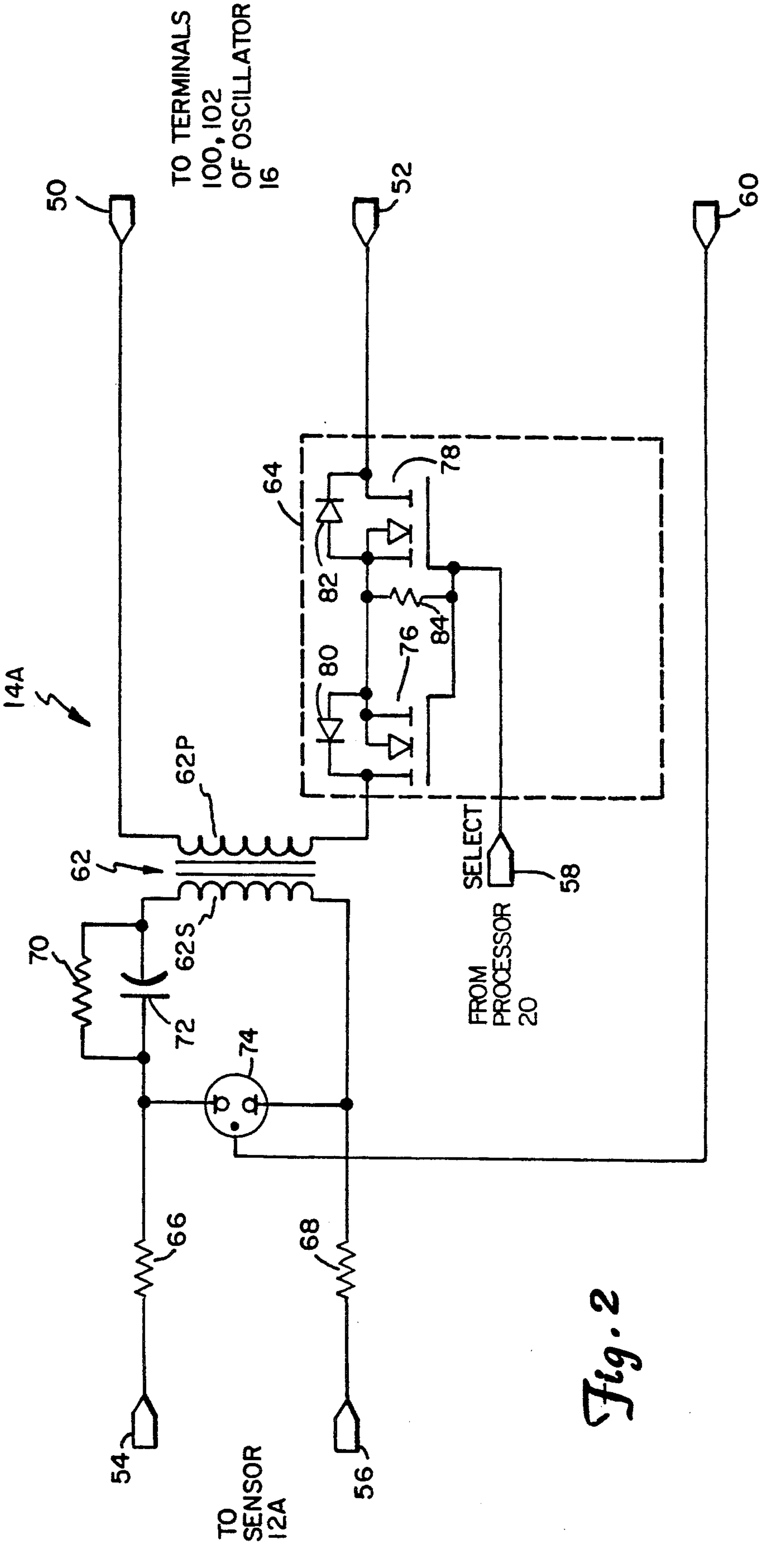
FIG. 2 is an electrical schematic diagram of an input circuit for use in the vehicle detector of FIG. 1.

FIG. 2 is an electrical schematic diagram of input circuit 14A, which connects sensor 12A to sensor drive oscillator 16 in response to a sensor select signal from processor 20. Input circuit 14A is representative of each of the input circuits 14A–14D of vehicle detector 10 of FIG. 1.

Input circuit 14A has six terminals. Terminals 50 and 52 are connected to sensor drive oscillator 16, and terminals 54 and 56 are connected through a lead-in cable (not shown) to inductive sensor 12A. Terminal 58 receives the sensor select signal from processor 20, and terminal 60 is connected through a protection resistor (not shown) to ground.

Input circuit 14A includes transformer 62, switch circuitry 64, resistors 66, 68 and 70, capacitor 72 and neon tube 74. Switch circuitry 64 forms a FET-based switch connected in series with primary winding 62P of transformer 62 between terminals 50 and 52. Resistors 66, 68 and 70 and capacitor 72 are connected with secondary winding 62S between terminals 54 and 56. Neon tube 74 is connected in parallel with the combination of resistor 70, capacitor 72 and secondary winding 62S to provide transient protection.

Switch 64 includes FETs 76 and 78, diodes 80 and 82 (which are integral parts of FETs 76 and 78), and resistor 84. Oscillator 16 is operably connected to sensor 12A when FETs 76 and 78 are turned on, and is disconnected from sensor 12A when FETs 76 and 78 are turned off.

Input circuit 14A as well as sensor 12A (and the lead-in cable which connects them) combine to form an inductive load which is driven by oscillator 16. Although the inductive load is primarily an inductive impedance, it does include resistive and capacitive components as well.

Figure 3:
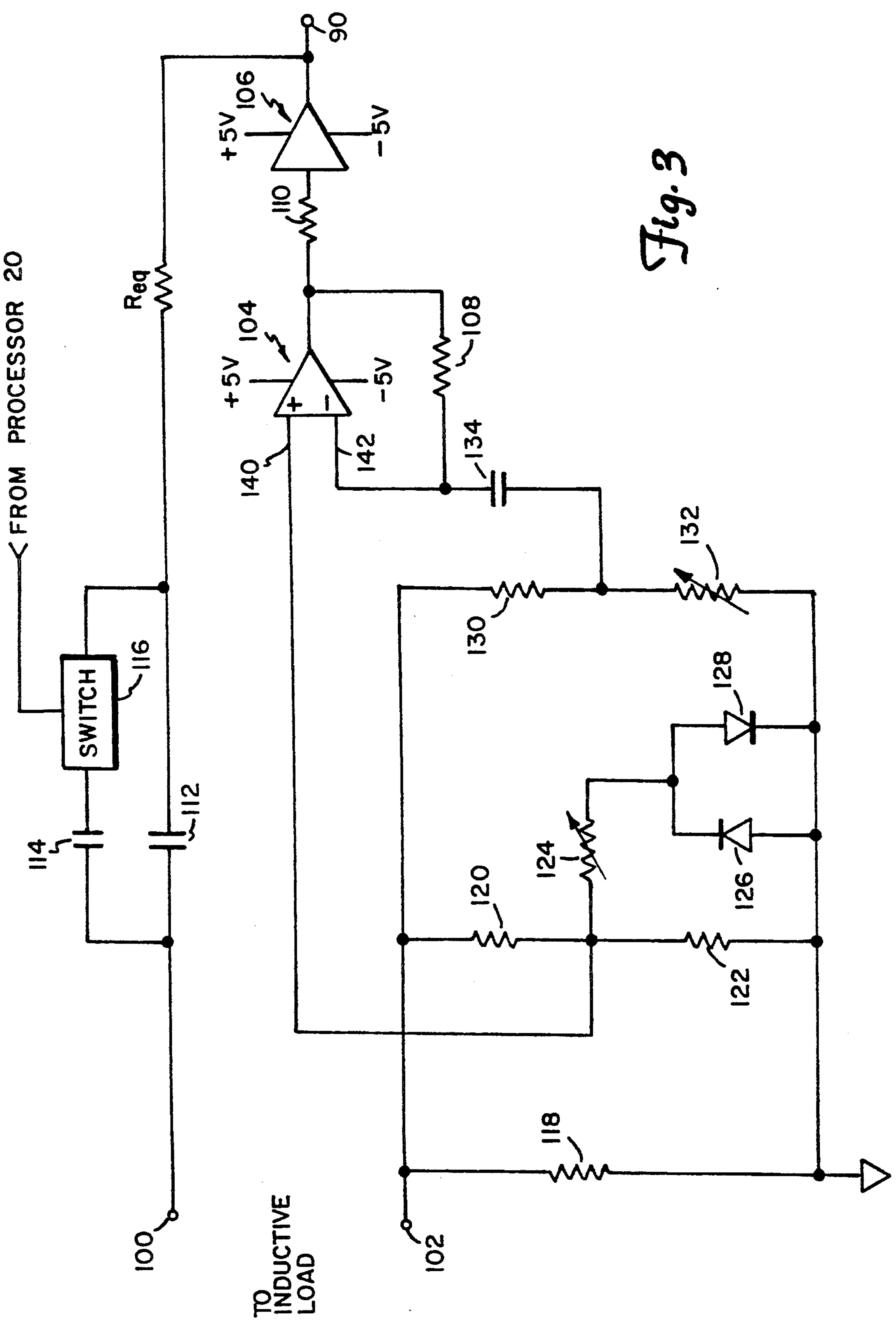
FIG. 3 is an electrical schematic diagram of a preferred embodiment of the series resonant oscillator of the present invention for use in the vehicle detector of FIG. 1.

FIG. 3 shows a preferred embodiment of sensor drive oscillator circuit 16 of the present invention. Oscillator circuit 16 is a series resonant oscillator which produces an oscillator signal at output terminal 90 which is a function of the inductance of inductive load connected to input terminals 100 and 102. Depending on the sensor select signal from processor 20, the inductive load can be any one of input circuits 14A–14D (with associated inductive sensor 12A–12D) or dummy sensor 12E.

Sensor drive oscillator circuit 16 includes a twostage amplifier circuit (formed by amplifiers 104 and 106 and resistors 108 and 110); a series resonant circuit (formed by capacitors 112 and 114, switch 116, the inductive load, equivalent resistance $R_{eq}$, and current sensing resistance 118); a positive feedback circuit (formed by resistors 120 and 122, potentiometer 124, and diodes 126 and 128); and a negative feedback circuit (formed by resistor 130, potentiometer 132, and capacitor 134).

The output of second stage amplifier 106 is connected to output terminal 90 to provide the oscillator signal. The output of amplifier 106 is also connected to a series resonant path which includes equivalent resistance $R_{eq}$, capacitor 112, the inductive load and current sensing resistor 118. If switch 116 is closed as a result of a control signal supplied by processor 20, capacitor 114 is connected in parallel with capacitor 112. The resonant frequency of this series resonant current path between output terminal 90 and ground is determined by the capacitance of either capacitor 112 by itself or the parallel combination of capacitors 112 and 114 (if switch 116 is closed), the inductance of the inductive load, and the total resistance of the series path. In this case, resistor $R_{eq}$ is shown in FIG. 3 to represent the equivalent resistance of all elements other than current sense resistor 118. Ideally, the only variable is the inductance of the inductive sensor 12A–12D, which will be affected by the presence of metal in a passing vehicle.

First stage amplifier 104 has a positive (+) input terminal 140 and a negative (−) input terminal 142. A first (positive) feedback signal is supplied to + terminal 140 by the positive feedback circuit which includes resistors 120 and 122, potentiometer 124, and diodes 126 and 128. This positive feedback circuit is connected across current sensing resistor 118 and provides a signal which changes during each half cycle as a result of the action of diodes 126 and 128. As the amplitude of the signal across resistor 118 increases during a positive half cycle, diode 128 will turn on, thus reducing the fraction of the signal across resistor 118 that appears at terminal 140 and thus also reducing the magnitude of the first feedback signal with respect to the magnitude of the second (negative) feedback signal. Similarly, during a negative half cycle diode 126 will turn on to reduce the magnitude of the first feedback signal with respect to the magnitude of the second feedback signal.

The second (negative) feedback circuit is a voltage divider formed by resistor 130 and potentiometer 132 which is connected across resistor 118, and which is AC coupled through capacitor 134 to the − input terminal 142 of amplifier 104. Capacitor 134 and resistor 108 allow a stable DC operating point for amplifier 104. The voltage across resistor 118 is primarily a function of current through the series resonant current path, and therefore the signal across current sensing resistor 118 is a function of the current which is being delivered to the inductive load (and thus to the inductive sensor 12A–12D).

The two feedback paths to first stage amplifier 104 allow oscillator 16 to start and stabilize very quickly, because loop gain is varied during each half cycle. In a preferred embodiment of the present invention, oscillator circuit 16 fully starts in less than two cycles of the resonant frequency. At every zero crossing of the oscillator signal at output terminal 90, the positive feedback to + input terminal 140 is initially greater than the negative feedback to − input terminal 142. This results in a gain which initially in every half cycle is significantly greater than one. As the magnitude of the current in the series path increases, the positive feedback decreases with respect to the negative feedback so that the gain is reduced to one or less as the peak of the half cycle is reached.

Oscillator circuit 16 provides a sine-wave drive to inductive sensors 12A–12D over a much wider range of load impedances than has been possible with the prior art parallel resonant loop oscillators. In addition, because the positive and negative feedback is based upon the current being delivered to the inductive load, rather than the voltage across the inductive load, inductive sensors 12A–12D are driven with constant AC currents regardless of the nominal inductance of the inductive load. As a result, consistent inductive sensor operation characteristics are assured, because the inductive sensor will be excited with the same current regardless of the type or length of lead-in cable used.

Oscillation is virtually guaranteed for any inductive sensor load, $R_{eq}$ and $L_{eq}$, as the gain, except for a small factor due to resistor 108, is independent of $L_{eq}$ and $R_{eq}$. The oscillator will always start quickly, because the gain can be guaranteed to be significantly greater than one at zero or low sensor currents. This permits nearly all of the inductive sensor active time to be used as measurement time.

In preferred embodiments, first stage amplifier 104 offers high input impedance at terminals 140 and 142 so that input impedance of amplifier 104 does not affect the two feedback circuits. Second stage amplifier 106 exhibits an output impedance which does not vary as a function of instantaneous current from output terminal 90. The output impedance of amplifier 106, does partially determine the nominal frequency of the series resonant circuit, but it does not cause changes in the resonant frequency of the series resonant circuit that are significant when compared to those caused by vehicles e sensor 12A–12D.

Table I is a list of the components used in the preferred embodiment of oscillator 16 shown in FIG. 3.

TABLE I

| | |
|---|---|
| Amplifier 104 | AD 847JR |
| Amplifier 106 | LH 0002CN |
| Resistor 108 | 6.8K ohm |
| Resistor 110 | 220 ohm |
| Capacitor 112 | .047 μF |
| Capacitor 114 | .047 μF |
| Switch 116 | 2N7002 (2) |
| Resistor 118 | 33 ohm |
| Resistor 120 | 1K ohm |
| Resistor 122 | 10K ohm |
| Potentiometer 124 | 0–10K ohm |
| Diode 126 | 1N914 |
| Diode 128 | 1N914 |
| Resistor 130 | 100 ohm |
| Potentiometer 132 | 0–2K ohm |
| Capacitor 134 | 1.0 μF |

Figure 4:
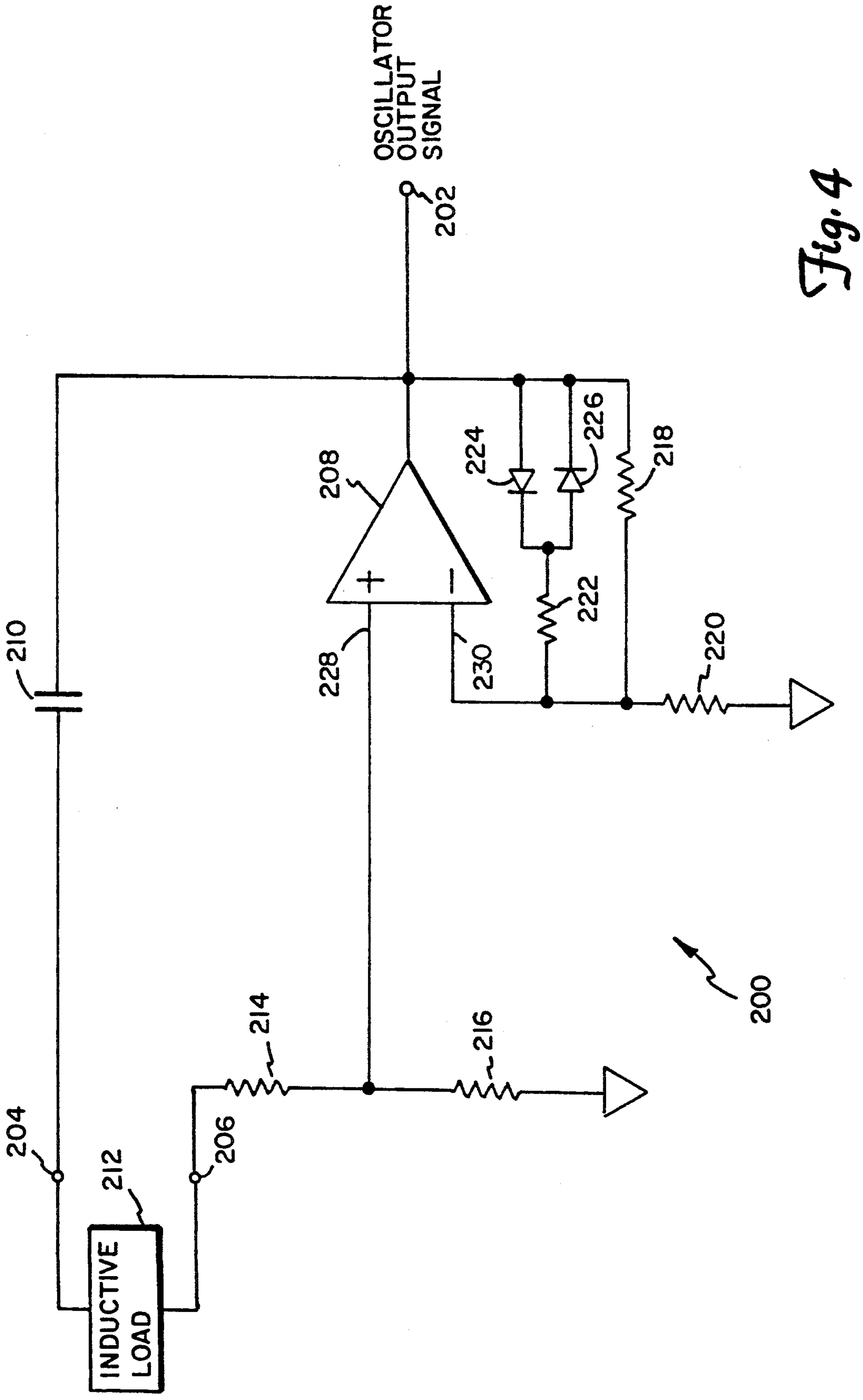
FIG. 4 is an electrical schematic diagram of another embodiment of the series resonant oscillator of the present invention.

FIG. 4 shows another embodiment of the series resonant oscillator of the present invention. Oscillator 200 of FIG. 4 includes output terminal 202, input terminals 204 and 206, amplifier 208, a series resonant circuit (formed by capacitor 210, inductive load 212, and resistors 214 and 216), and a negative feedback circuit (formed by resistors 218, 220, 222 and diodes 224 and 226).

Positive feedback is provided to + input terminal 228 of amplifier 208 from the junction of a voltage divider formed by resistors 214 and 216. In this embodiment, resistor 216 acts as the current sensing resistor, since the current through inductive load 212 is equal to the voltage across resistor 216 divided by the resistance of resistor 216.

Negative feedback in this embodiment is derived from output terminal 202, rather than from the current through the inductive load (as in oscillator 16 of FIG. 3). Resistors 218 and 220 form a voltage divider which has its junction connected to − input terminal 224 of amplifier 208. A non-linear circuit formed by resistor 222 and diodes 224 and 226 is connected in parallel with resistor 218. During each half cycle of the oscillator signal, the non-linear circuit causes a change in the relative amount of negative feedback with respect to positive feedback. As in the oscillator circuit of FIG. 3, oscillator 200 features greater relative positive feedback at the beginning of each half cycle than at the peak.

Like oscillator 16 of FIG. 3, oscillator 200 controls power delivered to a series resonant circuit as a function of current through inductive load 212. As a result, a constant AC current drive is achieved. The oscillator output signal has a frequency which varies as a function of inductance of inductive load 212.

Oscillator 16 of FIG. 3 has been found to be preferable for use with inductive loads having inductive sensors and lead-in cables whose equivalent series resistance is not carefully controlled. In those applications in which smaller equivalent series resistance changes occur, oscillator 200 of FIG. 4 offers the advantage of simpler construction and fewer components.

In conclusion, the series resonant oscillator of the present invention provides a stable drive to inductive sensors in a vehicle detector. Greater stability and consistent sensitivity over a wide range and wide variety of inductive loads is achieved.

Although the present invention has been described with reference to preferred embodiments, workers skilled in the art will recognize that changes may be made in form and detail without departing from the spirit and scope of the invention.

What is claimed is:

1. An oscillator circuit for producing an oscillator signal having a frequency which is a function of inductance of an inductive sensor, the oscillator circuit comprising:

- an inductive load which includes the inductive sensor;
- a capacitive impedance connected to the inductive load to form a resonant circuit;
- means for sensing current flowing through the inductive load; and
- means for supplying the oscillator signal to the resonant circuit as a function of the current sensed.

2. The oscillator circuit of claim 1 wherein the means for supplying the oscillator signal includes:

- amplifier means for producing the oscillator signal as a function of positive and negative feedback signals;
- means for providing the positive feedback signal as a function of the current sensed; and
- means for providing the negative feedback signal.

3. The oscillator circuit of claim 2 and further including:

- means for causing relative magnitudes of the positive and negative feedback signals to vary during each half cycle of the oscillator signal to maintain a constant AC current through the inductive load.

4. The oscillator circuit of claim 2 wherein the means for providing the negative feedback signal provides the negative feedback signal as a function of the current sensed.

5. The oscillator circuit of claim 1 wherein the inductive load, the capacitive impedance and the means for sensing current are connected in a series path.

6. An oscillator circuit for producing an oscillator signal having a frequency which is a function of inductance of an inductive sensor, the oscillator circuit comprising:

- an inductive load which includes the inductive sensor;
- a capacitive impedance connected in a series path with the inductive load;
- current sensing means for sensing current in the series path;
- amplifier means having first input terminal and an output terminal, for providing the oscillator signal at its output terminal as a function of a first feedback signal received at its first input terminal; the series path being connected to the output terminal; and
- a first feedback circuit for providing the first feedback signal as a function of current sensed by the current sensing means.

7. The oscillator circuit of claim 6 wherein the amplifier means includes a second input terminal, and wherein the oscillator circuit further includes:

- a second feedback circuit for providing a second feedback signal to the second input terminal.

8. The oscillator circuit of claim 7 wherein the first feedback circuit includes means for causing the first feedback signal to decrease in relative magnitude with respect to the second feedback signal as magnitude of the output signal increases.

9. The oscillator circuit of claim 8 wherein the first feedback signal is a positive feedback signal and the second feedback signal is a negative feedback signal.

10. The oscillator circuit of claim 8 wherein the current sensing means includes a current sensing resistor connected in the series path, the first feedback circuit includes a first voltage divider connected across the current sensing resistor, and the second feedback circuit includes a second voltage divider connected across the current sensing resistor.

11. The oscillator circuit of claim 10 wherein the means for causing the first feedback signal to change includes voltage sensitive means connected to the first voltage divider for changing voltage division of the first voltage divider as a function of voltage across the resistor.

12. The oscillator circuit of claim 7 wherein the second feedback circuit provides the second feedback signal as a function of current sensed by the current sensing means.

13. A detector system which uses an inductive sensor which exhibits changes in inductance as a function of presence of an object, the system comprising:

- an inductive load which includes an inductive sensor;
- a series resonant oscillator circuit, for driving the inductive load with an oscillator signal, which includes a capacitive impedance connected in a series path with the inductive load, current sensing means for sensing current flowing through the inductive load, and means for controlling the oscillator signal as a function of current sensed by the current sensing means so that frequency of the oscillator signal changes as a function of changes in inductance of the inductive load; and means for providing a detector output based upon the frequency of the oscillator signal.

14. The system of claim 13 wherein the series resonant oscillator circuit includes:

amplifier means having a first input terminal, a second input terminal, and an output terminal which is connected to the series path, for producing the oscillator signal at the output terminal as a function of a first feedback signal at the first input terminal and a second feedback signal at the second input terminal;

a first feedback circuit for providing the first feedback signal to the first input terminal as a function of current sensed by the current sensing means; and a second feedback circuit for providing the second feedback signal to the second input terminal.

15. The system of claim 14 wherein the first feedback circuit includes means for causing the first feedback signal to decrease in relative magnitude with respect to the second feedback signal as magnitude of the current sensed increases.

16. The system of claim 14 wherein the second feedback circuit provides the second feedback signal as a function of the current sensed.

17. A detector system which uses an inductive sensor, the system comprising:

an inductive load which includes the inductive sensor;

an oscillator circuit for supplying an oscillator signal having a frequency which is a function of inductance of the inductive sensor, the oscillator circuit including means for sensing current flow through the inductive load, and means for controlling the oscillator signal as a function of the current sensed so that the inductive load receives a constant AC current drive despite changes in inductance of the inductive sensor; and means for providing a detector output based upon the frequency of the oscillator signal.

18. The detector system of claim 17 wherein the oscillator circuit includes a series resonant current path in which the inductive load is connected.

19. The detector system of claim 18 wherein the means for controlling the oscillator signal includes:

means for producing positive and negative feedback signals as a function of the current sensed; and means for producing the oscillator signal as a function of the positive and negative feedback signals.

20. The detector system of claim 19 and further including:

means for causing relative levels of the positive and negative feedback signals to vary during each half cycle of the oscillator signal.

21. A vehicle detector for use with an inductive sensor which changes inductance in response to presence of a vehicle, the vehicle detector comprising:

an input circuit connected to the inductive sensor;

a series resonant oscillator connected to the input circuit for providing a constant AC current drive signal to the inductive sensor, the series resonant oscillator producing an oscillator output signal which is a function of current through an inductive load formed by the input circuit and the inductive sensor and which has a frequency which is a function of the inductance of the inductive sensor;

means for measuring frequency of the oscillator output signal; and means for providing a detector output signal based upon the frequency measured.

* * * * *